United States Patent [19]

Stormer

[11] Patent Number: 5,080,539
[45] Date of Patent: Jan. 14, 1992

[54] TRACER FOR ROUTER HEAD

[75] Inventor: A. David Stormer, Mt. Clemens, Mich.

[73] Assignee: The United States of America as represented by the Secretary of the Army, Washington, D.C.

[21] Appl. No.: 648,094

[22] Filed: Jan. 31, 1991

[51] Int. Cl.⁵ .................... B23C 3/00; B43L 13/00
[52] U.S. Cl. .................... 409/124; 33/1 M; 33/18.1; 409/126
[58] Field of Search ............ 409/85, 109, 123, 124, 409/125, 86, 93, 126; 29/36, 40; 33/18.2, 18.1, 628, 1 M; 144/144 R

[56] References Cited

U.S. PATENT DOCUMENTS

| | | | |
|---|---|---|---|
| 3,841,368 | 10/1974 | Ritter | 409/85 X |
| 4,297,060 | 10/1981 | Ross | 409/124 X |
| 4,324,047 | 4/1982 | Roch | 33/18.1 |
| 4,426,783 | 1/1984 | Gerber et al. | 33/1 M |

Primary Examiner—William Briggs
Attorney, Agent, or Firm—Peter A. Taucher; Gail S. Soderling

[57] ABSTRACT

A tracing head is disclosed which will allow a programmable router to trace the programmed path of the router on an inexpensive media to check the programming. This avoids the time and material wastage resulting from cutting metal plated circuit boards without being able to check the programming path.

1 Claim, 1 Drawing Sheet

TRACER FOR ROUTER HEAD

GOVERNMENT INTEREST

The invention described herein may be manufactured, used and licensed by or for the Government for governmental purposes without payment to me of any royalty.

BACKGROUND OF THE INVENTION

1. Field of the Invention

In one aspect this invention relates to machinery for making circuit boards. In a further aspect, this invention relates to a method of making a preliminary tracing to check the programming and lay out of a circuit board pattern.

2. Prior Art

Double sided copper clad circuit boards are expensive to purchase and repair. For use in low production situations and prototyping, the boards are routed to form channels. Prior to routing the required channels, the board is coated with nickel alloy to provide better solder adhesion and provide a corrosion resistant coating on the copper surface. The board preparation and initial cost means the raw material cost per board is high and consequently mistakes in routing programs will generate high scrappage costs. No matter how carefully the router program is generated and how meticulously the program is run errors are frequent on the initial phase of a run until the errors can be eliminated and the programmed router will cut proper circuit boards. The present system of program and cut a board followed by changes and recut until the desired board configuration is obtained results in high scrap rates particularly where the boards are being cut in low production or experimental quantities. It is desired to have a system where expensive circuit boards are not the raw material for testing programs.

SUMMARY OF THE INVENTION

The present invention provides a system which allows the router program to be tested and the circuit board to be cut to be checked using inexpensive materials and minimum time. The system of this invention has a tracing head which can be attached to the router and will provide an exact ink tracing of the circuit which has been programmed on paper. The resulting tracing can be measured and the program readjusted until the desired circuit is obtained with the desired characteristics.

The tracing head of this invention has a bracket which is adapted to be attached to the router portion of a router machine which can be programmed to cut circuit patterns in metal coated circuit boards. The bracket has an arm which can be attached to the router head and has a longitudinal bore which will be oriented with its axis parallel to the axis of the router head which will be used to cut the final circuit configuration. An ink reservoir is mounted in the longitudinal bore and has a writing tip mounted on one end. The writing tip replaces the router bit for testing purposes. A biasing means is associated with the bracket and the reservoir to urge the writing tip into engagement with the paper to receive the traced pattern.

DETAILED DESCRIPTION OF PREFERRED EMBODIMENTS

Figure 1:
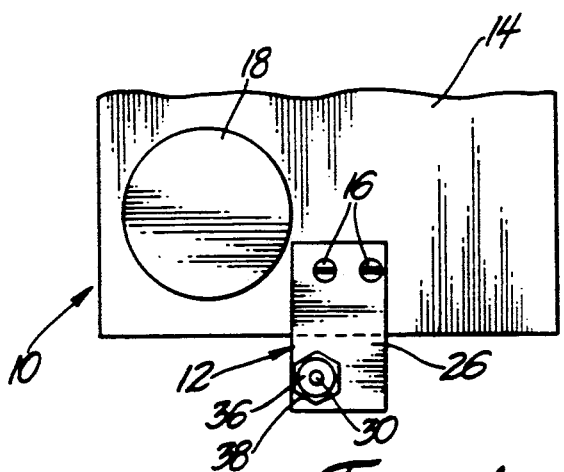
FIG. 1 is top view of a router with a tracing head of this invention attached.

Referring to the accompanying drawing in which like numerals refer to like parts and initially to FIG. 1, a router head 10 attached to a programmable router machine (not shown) has a tracing head 12 secured to the face plate 14 of the router by a pair of set screws 16. As shown, only the router motor 18 is visible and the remainder of the router equipment is not disclosed since it is known in the art and forms no part of this invention.

Figure 2:
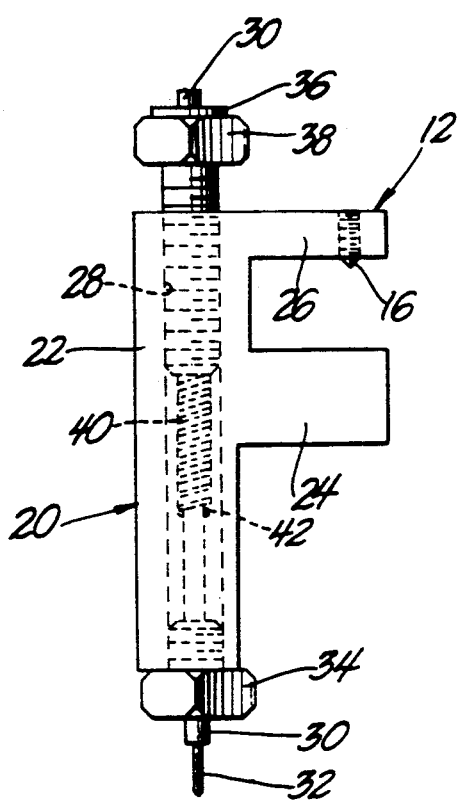
FIG. 2 is a side view of the tracing head of FIG. 1.

FIG. 2 shows the tracing head of this invention in greater detail. The tracing head 12 has a bracket 20 with a vertically extending leg 22 and two horizontally extending arms 24, 26. The horizontally extending arms 24, 26 form a gap which can be positioned so that the arms are disposed on opposite sides of the router face plate 14 so as to enclose a portion of the router head within the gap. The tracing head 12 can then be secured in place by tightening the set screws 16 until they firmly contact the router head. The tracing head and router head can also be designed so there are complimentary threaded apertures in the heads and the heads can be joined by inserting set screws or other threaded fasteners into the threaded apertures. In either case the result is the vertical leg 22 of the bracket is held in a vertical position parallel to the axis of the router bit which will be used to cut the programmed circuit as the router head is moved. The bracket has a longitudinally extending bore 28. The bore 28 will hold an ink reservoir 30 and other ancillary parts as will be explained later.

Figure 3:
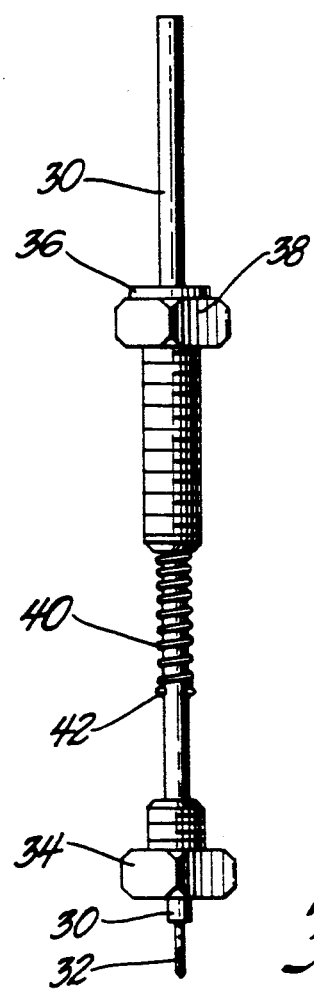
FIG. 3 is a side view of the ink reservoir and biasing means.

The ink reservoir 30 and its associated equipment are shown in greater detail in FIG. 3 after being removed from the bore 28 of the bracket 20. As shown, the ink reservoir 30 is an elongated cylinder with a writing tip 32 located on one end a threaded fastener 34 is located on the end of the reservoir nearest the writing tip and is adapted to hold the tip firmly in position. The opposite end of the reservoir has a disc 36 which acts as a stop to prevent movement of a threaded fastener 38 along the reservoir 30. The threaded fastener 38 has a longitudinal cavity extending through its center the cavity holding the ink reservoir in a firm fixed position relative to the fastener A spring 40 is coaxially mounted around the reservoir 30 with one end in contact with the threaded fastener 38 and the other end in contact with a stop 42. The spring 40 will provide a biasing means to control the pressure applied by the writing tip 32.

OPERATION

When it is desired to use the tracing head of this invention, the router is programmed to rout the desired circuit in the plated circuit board. The ink reservoir 30 is inserted into the bore 28 and the threaded fastener 38 turned slightly into the complimentary threads in the bracket. The first fastener 34 can then be placed over the writing tip turned to engage the first complimentary threads in the bracket. The assembled tracing head will allow the reservoir free movement along the bore 28 in one direction until the stop 42 engages the surface of the first threaded fastener 34 and along the other direction until the spring is compressed.

The assembled tracing head 12 is then attached to the router face plate 14 by mechanical means. One example would be the use of two or more threaded set screws which would engage threads in the tracing head arm 26 and the router face plate. Other attachment means are within the skill of the art and examples are omitted in the interest of brevity.

To check the programming, a piece of tracing paper or other media designed to receive the ink from the reservoir is placed under the tracing head. The pressure of the writing tip against the media can be controlled and adjusted by advancing the second threaded fastener further into the bore 28 thereby compressing the spring 40 and controlling the force with which the tip contacts the media.

The router is then operated and the resulting tracing will give an accurate portrayal of the circut the router will cut in the circut board. The resulting circut can be measured and compared with the desired circut. Changes can be made and programming checked until the desired results are achieved. Once the programming is correct, the circut boards can be cut. This technique will save the expense and time normally associated with making the metal coated circut boards by providing a quick efficient means to check the router programming.

Various modifications and alterations will become apparent to those skilled in the art with out departing from the scope and spirit of this invention and it is understood that this invention is not limited to the illustrative embodiments set forth above.

What is claimed is:

1. A tracing head for use with a circuit board routing machine having a router face plate, the router being preprogrammed to custom cut a metal plated circuit board in a predetermined pattern so as to prepare the board for the receipt of electrical components comprising: a bracket having two horizontally extending arms which form a gap so the arms can be disposed on opposite sides of the router face plate the arms being adapted to being attached to the router face plate of the router machine to enclose a portion of the router face plate, the bracket having a vertically extending leg attached to the two horizontally extending arms, the vertically extending leg having a bore longitudinally extending therethrough, fastening means associated with the arms to attach the arms solidly to the router face plate, an ink reservoir coaxially mounted within the longitudinally extending bore, the reservoir having a writing tip on the end of the reservoir distal the router, an adjustable biasing means associated with the reservoir to provide sufficient biasing force to keep the writing tip in contact with a piece of paper; and fasteners at each end of the reservoir to hold the reservoir aligned within the bore while permitting motion longitudinally within the bore.

* * * * *